United States Patent
Moon et al.

(10) Patent No.: US 11,143,974 B1
(45) Date of Patent: Oct. 12, 2021

(54) CLEANING METHOD AND CLEANING SYSTEM FOR RETICLE POD

(71) Applicant: SAMSUNG ELECTRONICS CO., LTD., Suwon-si (KR)

(72) Inventors: Yongseung Moon, Suwon-si (KR); Sungyong Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/021,120

(22) Filed: Sep. 15, 2020

(30) Foreign Application Priority Data

May 20, 2020 (KR) .................. 10-2020-0060123

(51) Int. Cl.
*G03F 7/20* (2006.01)
*G03F 1/66* (2012.01)
*H01L 21/673* (2006.01)

(52) U.S. Cl.
CPC ............ *G03F 7/70925* (2013.01); *G03F 1/66* (2013.01); *G03F 7/70741* (2013.01); *H01L 21/67359* (2013.01)

(58) Field of Classification Search
CPC .... G03F 7/70925; G03F 1/66; G03F 7/70741; H01L 21/67359
See application file for complete search history.

(56) References Cited

U.S. PATENT DOCUMENTS

| | | | |
|---|---|---|---|
| 5,363,867 A * | 11/1994 | Kawano | B08B 9/093 134/95.2 |
| 5,367,139 A | 11/1994 | Bennett et al. | |
| 6,136,256 A | 10/2000 | Bingham et al. | |
| 6,392,738 B1 * | 5/2002 | van de Pasch | G03F 7/707 355/30 |
| 6,715,495 B2 | 4/2004 | Dao et al. | |
| 7,629,556 B2 | 12/2009 | Rastegar | |
| 8,197,603 B2 | 6/2012 | Jackson | |
| 8,902,399 B2 | 12/2014 | Compen et al. | |
| 9,851,643 B2 | 12/2017 | Chilese et al. | |
| 10,067,418 B2 | 9/2018 | Chang et al. | |
| 2003/0102015 A1 * | 6/2003 | Halbmaier | H01L 21/67051 134/30 |
| 2010/0126531 A1 * | 5/2010 | Ku | B08B 3/10 134/26 |
| 2010/0151394 A1 | 6/2010 | Scaccabarozzi et al. | |
| 2011/0180108 A1 * | 7/2011 | Pan | G03F 1/66 134/21 |
| 2012/0328403 A1 * | 12/2012 | Rebstock | H01L 21/68707 414/730 |
| 2014/0007371 A1 * | 1/2014 | Lu | B05C 13/02 15/339 |
| 2014/0014138 A1 | 1/2014 | Spiegelman et al. | |
| 2015/0107618 A1 * | 4/2015 | Sun | C23C 16/4405 134/1.2 |
| 2020/0249588 A1 * | 8/2020 | Watanabe | G03F 1/82 |

* cited by examiner

*Primary Examiner* — Steven Whitesell Gordon
(74) *Attorney, Agent, or Firm* — Lee IP Law, P.C.

(57) ABSTRACT

A method of cleaning a reticle pod and an exposure method, the method of cleaning the reticle pod including receiving the reticle pod that includes an inner pod and an outer pod surrounding the inner pod; disassembling the inner pod from the outer pod; inspecting a surface of a base plate of the inner pod to detect defects; performing a local plasma cleaning process at a defect location on the surface of the base plate; performing a wet cleaning process on the inner pod; and reassembling the inner pod to the outer pod.

19 Claims, 8 Drawing Sheets

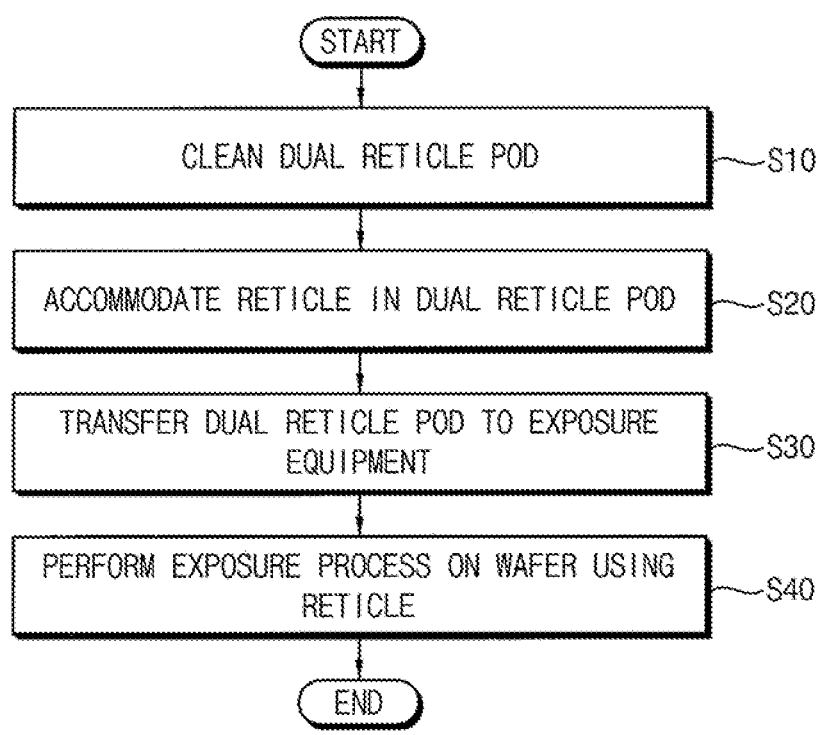

CLEANING METHOD AND CLEANING SYSTEM FOR RETICLE POD

CROSS-REFERENCE TO RELATED APPLICATION

Korean Patent Application No. 10-2020-0060123, filed on May 20, 2020, in the Korean Intellectual Property Office, and entitled: "Cleaning Method and Cleaning System for Reticle Pod," is incorporated by reference herein in its entirety.

BACKGROUND

1. Field

Embodiments relate to a cleaning method and a cleaning system for a reticle pod.

2. Description of the Related Art

In a lithography process, a reticle may be used to transfer a desired pattern onto a substrate such as a wafer. A reticle pod may be used in a semiconductor process to store the reticle and facilitate carrying and transporting of the reticle between platforms, thereby isolating the reticle from the external environment to maintain the cleanliness of the reticle.

SUMMARY

The embodiments may be realized by providing a method of cleaning a reticle pod, the method including receiving the reticle pod that includes an inner pod and an outer pod surrounding the inner pod; disassembling the inner pod from the outer pod; inspecting a surface of a base plate of the inner pod to detect defects; performing a local plasma cleaning process at a defect location on the surface of the base plate; performing a wet cleaning process on the inner pod; and reassembling the inner pod to the outer pod.

The embodiments may be realized by providing a method of cleaning a reticle pod, the method including receiving a dual reticle pod that includes an inner pod and an outer pod; disassembling the dual reticle pod to extract the inner pod; inspecting a surface of a base plate of the inner pod to detect defects; performing a local plasma cleaning process at a defect location on the surface of the base plate using an atmospheric pressure plasma injector; performing wet cleaning processes on the inner pod and the outer pod respectively; and reassembling the dual reticle pod to attach the inner pod and the outer pod.

The embodiments may be realized by providing an exposure method including receiving a dual reticle pod; cleaning the dual reticle pod; accommodating a reticle within the cleaned dual reticle pod; transferring the dual reticle pod containing the reticle to exposure equipment; and performing an exposure process on a wafer using the reticle; wherein cleaning the dual reticle pod includes disassembling the dual reticle pod to extract an inner pod; detecting defects by inspecting a surface of a base plate of the inner pod; performing a local plasma cleaning process at a defect location on the surface of the base plate using an atmospheric pressure plasma injector; and performing a wet cleaning process on the inner pod.

BRIEF DESCRIPTION OF THE DRAWINGS

Features will be apparent to those of skill in the art by describing in detail exemplary embodiments with reference to the attached drawings in which:

FIG. 11 is a flow chart of an exposure method in accordance with example embodiments.

DETAILED DESCRIPTION

Figure 1:
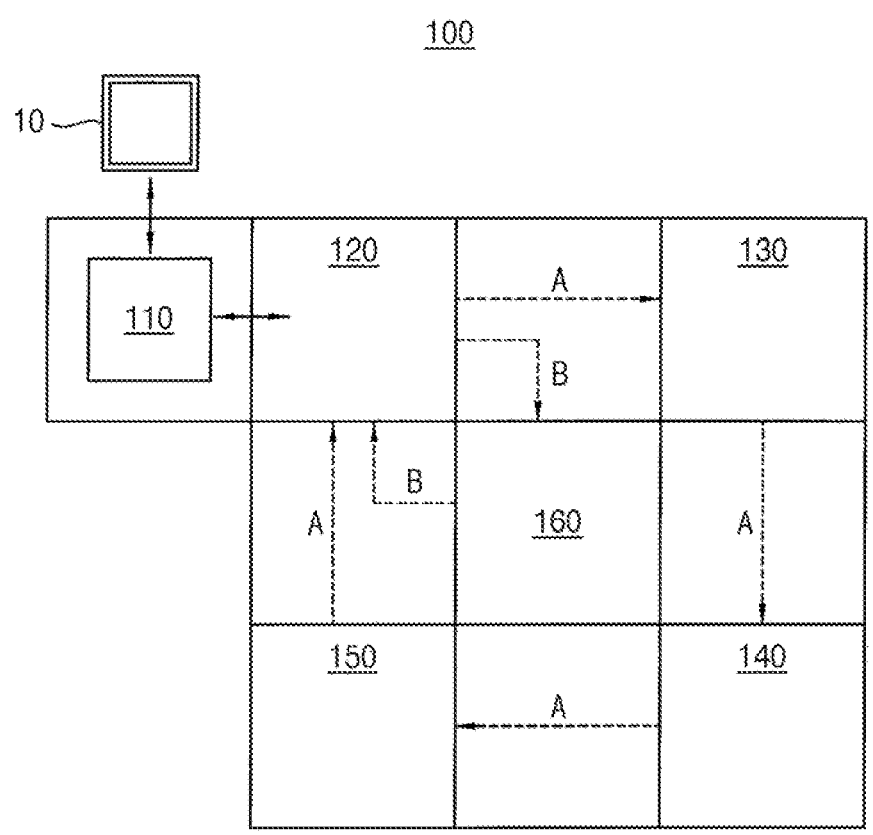
FIG. 1 is a block diagram of a cleaning system for a reticle pod in accordance with example embodiments.
Figure 2:
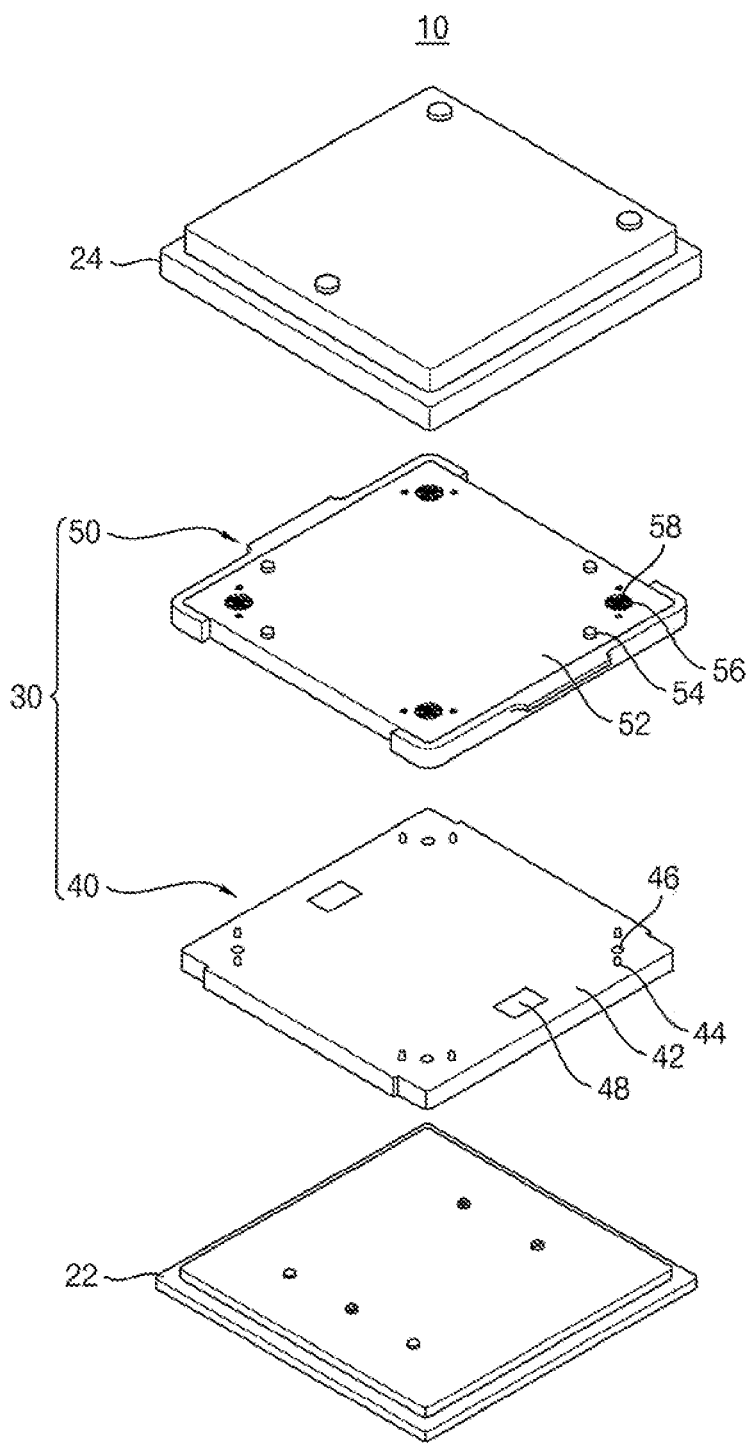
FIG. 2 is an exploded perspective view of a reticle pod to be cleaned by the cleaning system in FIG. 1.
Figure 3:
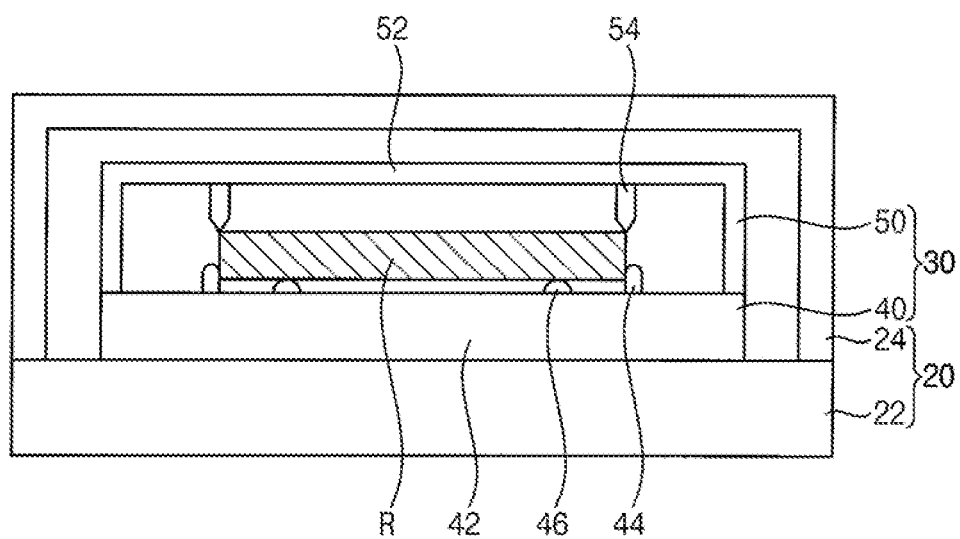
FIG. 3 is a cross-sectional view of the reticle pod of FIG. 2.
Figure 4:
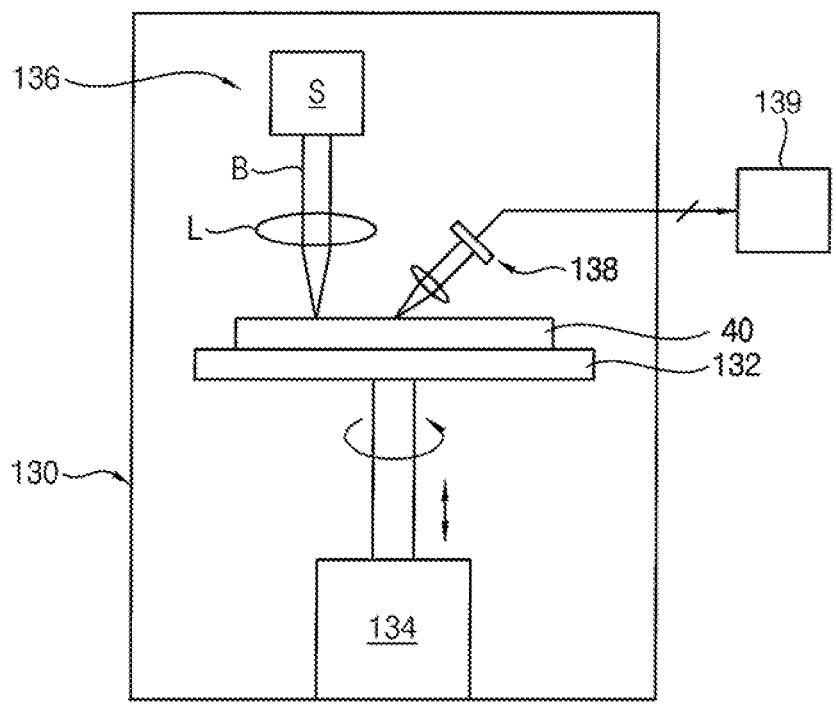
FIG. 4 is a cross-sectional view of a pod inspection part of the cleaning system of FIG. 1.
Figure 5:
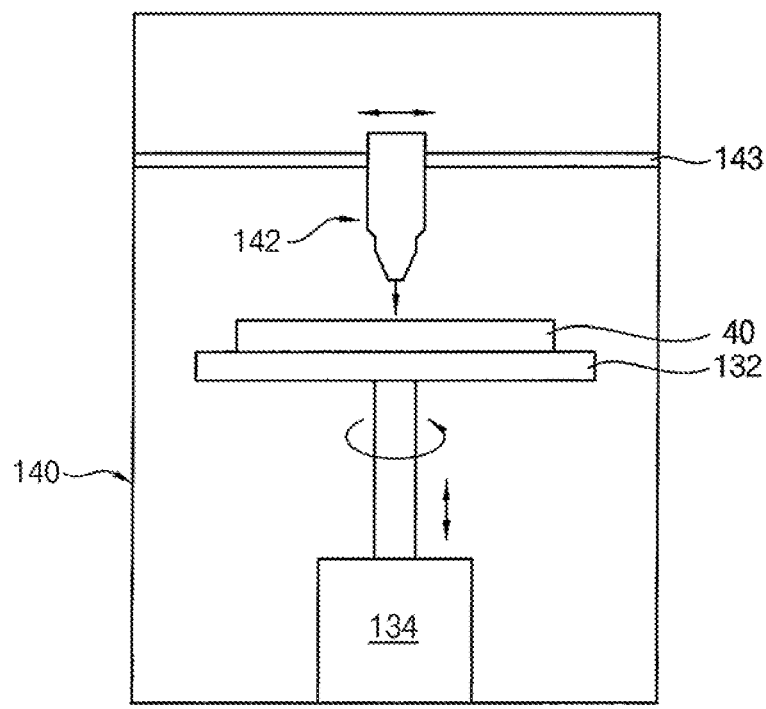
FIG. 5 is a cross-sectional view of a plasma cleaning part of the cleaning system of FIG. 1.
Figure 6:
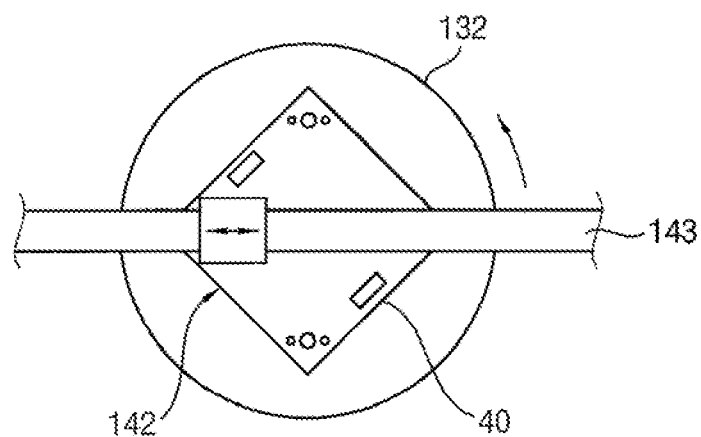
FIG. 6 is a plan view of a pod stage of the plasma cleaning part of FIG. 5.
Figure 7:
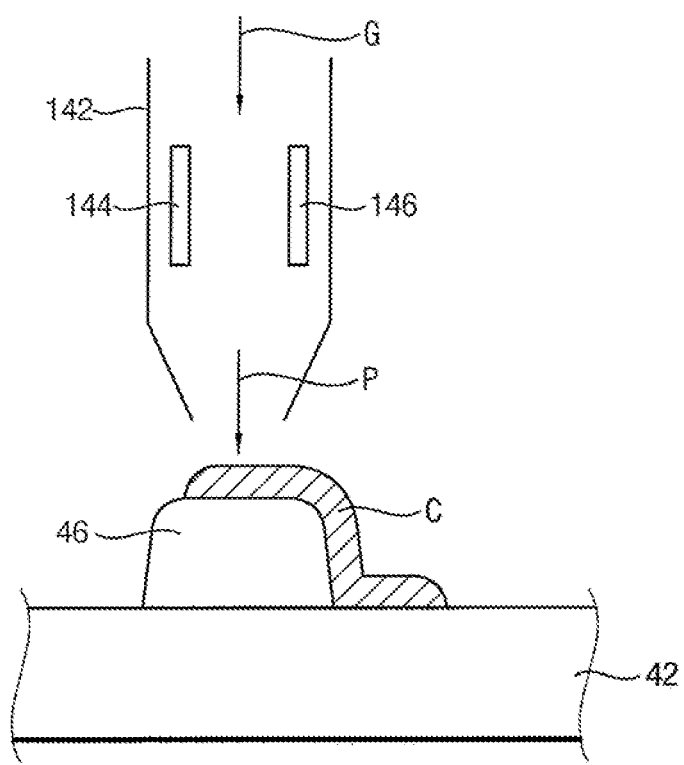
FIG. 7 is a cross-sectional view of a portion of a plasma nozzle that injects gas plasma onto an inner pod surface on the pod stage of FIG. 5.
Figure 8:
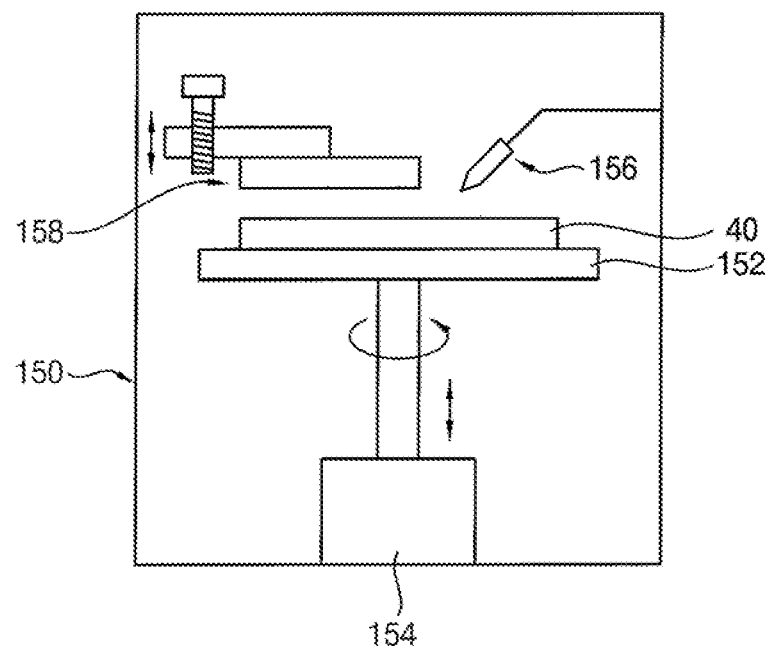
FIG. 8 is a cross-sectional view of a wet cleaning part of the cleaning system of FIG. 1.

FIG. 1 is a block diagram of a cleaning system for a reticle pod in accordance with example embodiments. FIG. 2 is an exploded perspective view of a reticle pod to be cleaned by the cleaning system of FIG. 1. FIG. 3 is a cross-sectional view of the reticle pod of FIG. 2. FIG. 4 is a cross-sectional view of a pod inspection part of the cleaning system of FIG. 1. FIG. 5 is a cross-sectional view of a plasma cleaning part of the cleaning system of FIG. 1. FIG. 6 is a plan view of a pod stage of the plasma cleaning part of FIG. 5. FIG. 7 is a cross-sectional view of a portion of a plasma nozzle that injects gas plasma onto an inner pod surface on the pod stage of FIG. 5. FIG. 8 is a cross-sectional view of a wet cleaning part of the cleaning system of FIG. 1.

Referring to FIGS. 1 to 8, a reticle pod cleaning system 100 may include a pod loading part 110, a pod disassembly/assembly part 120, a pod inspection part 130, a plasma cleaning part 140, a first wet cleaning part 150, and a second wet cleaning part 160.

In an implementation, the reticle pod cleaning system 100 may be used to remove contaminants such as particles or stains from a surface of a reticle pod 10 that has been shipped from a manufacturer or used a certain number of times in a semiconductor manufacturing plant (Fab). The dashed lines A and B in FIG. 1 illustrate the movement of the reticle pod 10 through the reticle pod cleaning system 100 after entry at the pod loading part 110, to the pod disassembly/assembly part 120, to the wet cleaning parts 150 and 160, and back out again. In an implementation, the dashed line A indicates the movement of an inner pod and the dashed line B indicates the movement of an outer pod. In an implementation, the reticle pod 10 may be an EUV reticle pod for accommodating an extreme ultraviolet (EUV) lithography reticle R.

As illustrated in FIGS. 2 and 3, the reticle pod 10 may be a dual reticle pod. Here, FIG. 3 represents a case in which the reticle R is accommodated in the reticle pod 10 of FIG. 2. The dual reticle pod 10 may include an outer pod 20, commonly referred as a reticle Standard Mechanical Interface (SMIF) pod (RSP) and an inner pod 30, commonly referred as an EUV inner pod (EIP). The outer pod 20 may be suitable for transporting EUV masks among various manufacturing stations and sites. The inner pod 30 may be a protective enclosure that allows the reticle R to remain within a protective environment until inside vacuum and near the reticle stage. The inner pod 30 and the outer pod 20 may be designed in a manner that facilitates their opening, closing and general manipulation.

The reticle (R) may be stored in the inner pod 30. The reticle R may be loaded into exposure equipment for performing an exposure process while mounted in the inner pod 30. The outer pod 20 may be an enclosure to protect the inner pod 30. The inner pod 30 may be accommodated in the outer pod 20 to store and transport the reticle R mounted in the inner pod 30. The reticle R may be stored and transported in a double packaged state by the inner pod 30 and the outer pod 20 when outside the manufacturing stations.

The inner pod 30 may include a base plate 40 and a cover 50 covering the base plate 40. The reticle R may be stored facing downward in the inner pod 30. In an implementation, a printed surface of the reticle R may face the base plate 40, and a rear surface of the reticle R may face the cover 50. The inner pod 30 may be formed of a metallic material. In an implementation, a plating layer may be formed on the surface of the inner pod 30 to help prevent particles from being generated. In an implementation, the plating layer may include a metal such as nickel (Ni).

The base plate 40 may include a first plate portion 42, a guide pin 44 and a support portion 46 on an upper surface of the first plate portion 42, and a window 48 on the first plate portion 42. The guide pin 44 may contact an outer surface of the reticle R to fix a position of the reticle R. The support portion 46 may have a shape protruding from the upper surface of the first plate portion 42. The support portion 46 may contact an edge of the printed surface of the reticle R to support the reticle R. The reticle R accommodated therein may be observed through the window 48.

The guide pin 44 and the support portion 46 may protrude from the upper surface of the base plate 40 to contact and support the reticle R. Accordingly, if external vibrations or impacts were to occur, particles could be generated at the contact points between the guide pin 44 and the support portion 46. Further, contaminants such as stains could remain on the base plate 40 when drying is poor after coating a plating solution to form the plating layer on the surface of the base plate 40. As described below, the reticle pod 10 without the reticle R therein may be loaded into the cleaning system 100 in order to remove such particles and contaminants.

The cover 50 may include a second plate portion 52 having a shape for covering the base plate 40 and a vent hole 56, a hold-down pin 54 on a surface of the second plate portion 52, and a particle filter 58 covering the vent hole 56.

As illustrated in FIG. 3, the hold-down pin 54 may press down on an edge portion of a side wall of the reticle R on the base plate 40 to help fix the position of the reticle R. The hold-down pin 54 may have an inclined surface in contact with the reticle R.

The outer pod 20 (for packaging the inner pod 30) may include an outer pod door 22 and an outer pod shell 24. The outer pod shell 24 may be engaged with the outer pod door 22. The inner pod 30 may be accommodated in an inner space when the outer pod door 22 and the outer pod shell 24 are combined with each other. The inner pod 30 may be stored and transported in a state stored in the outer pod 20.

The guide pin 44 and the support portion 46 may protrude from the upper surface of the base plate 40 to contact and support the reticle R. The hold-down pin 54 may protrude from the lower surface of the cover 50 to contact and fix the reticle R. Accordingly, if external vibration or impacts were to occur, particles could be generated at the contact points of the reticle R with the guide pin 44, the support portion 46, and/or the hold-down pin 54. If a coating solution were not dried well after coating the plating solution to form the plating layer on the surface of the base plate 40 or the cover 50, contaminants such as stains could remain on the base plate 40 or the cover 50.

In order to remove these particles and contaminants from the reticle pod 10 that has been shipped from the manufacturer or has been used a certain number of times in the semiconductor manufacturing factory (Fab), the reticle pod 10 (without the reticle R therein) may be loaded into the pod loading part 110 of the cleaning system 100.

In an implementation, the reticle pod 10 (from which the reticle R has been removed) may be loaded into the pod loading part 110 of the reticle pod cleaning system 100. The loaded reticle pod 10 may be disassembled or separated into the outer pod 20 and the inner pod 30 (e.g., detached from one another) by one or more manipulators of the pod disassembly/assembly part 120.

The detached inner pod 30 may be sequentially transferred to the pod inspection part 130, the plasma cleaning part 140, and the first wet cleaning part 150 by the manipulator or a transfer robot. The outer pod 20 may be transferred to the second wet cleaning part 160 by the manipulator or a transfer robot. In an implementation, the detached outer pod 20 may be transferred to the second wet cleaning part 160 through the pod inspection part 130 and the plasma cleaning part 140.

The movement of the inner pod 30 and the outer pod 20 may be determined according to the type of the particles or contaminants. In an implementation, if the inspection result of the pod inspection part 130 is good (e.g., if the parts of the reticle pod 10 are relatively clean), the inner pod 30 or the outer pod 20 in the pod inspection part 130 may be transferred directly to the first wet cleaning part 150 or may be directly transferred to the second wet cleaning part 160 without having to go through the plasma cleaning part 140.

In an implementation, as illustrated in FIG. 4, the pod inspection part 130 may include a pod stage 132 for supporting the base plate 40 (or the cover 50) of the inner pod 30 and an optical inspection system.

The pod inspection part 130 may be configured as a scanning system. An inspection spot of the pod inspection part 130 may be moved relative to the surface of the base plate 40 of the inner pod 30. In an implementation, when an incident beam B is moved along one direction, the pod stage 132 may be rotated by a driver 134 to inspect the entire surface of the base plate 40. In an implementation, various embodiments for determining the surface position of the base plate 40 for scanning inspection may be used.

The incident beam B (generated by an illumination light source S) may be incident on the surface of the base plate 40 at a constant incident angle. In an implementation, the illumination light source S may include a laser, a diode laser, an argon laser, a xenon arc lamp, or the like. The incident beam B may be focused onto the surface of the base plate 40 by an objective lens L, and light reflected from the surface of the base plate 40 may be collected by a detector array 138. Detection signals generated in the detector array 138 may be provided to a computing system 139, and defect locations of contaminants such as stains may be detected. In an implementation, the location of the contaminant remaining on the surface of the base plate 40 may be designated as a defect location.

When a defect is found at a defect location on the surface of the base plate 40, the base plate 40 may be moved to the plasma cleaning part 140 in order to remove the defect. When a defect is not found on the surface of the base plate 40, the base plate 40 may be moved directly to the first wet cleaning part 150 without going through the plasma cleaning part 140.

In an implementation, as illustrated in FIGS. 5 to 7, the plasma cleaning part 140 may include the pod stage 132 for supporting the base plate 40 (or the cover 50) and a plasma nozzle injector.

The pod stage 132 supporting the base plate 40 may be moved from the inspection station of the pod inspection part 130 to the cleaning station of the plasma cleaning part 140. In an implementation, the base plate 40 on the pod stage 132 of the pod inspection part 130 may be transferred by the transfer robot to another pod station of the plasma cleaning part 140.

In an implementation, the plasma nozzle injector may be an atmospheric pressure plasma jet injector. The plasma nozzle injector may include a plasma nozzle 142 for discharging gas plasma (P). The plasma nozzle 142 may be movable along a nozzle arm 143 installed over the pod stage 132. The plasma nozzle 142 may perform a local cleaning process by rotation of the pod stage 132 and a translational movement along the nozzle arm 143. For example, the plasma nozzle 142 may be moved toward the defect location on the surface of the base plate 40. The plasma nozzle 142 may move to the location that has been determined as the defect location to perform a local plasma cleaning process.

The plasma nozzle 142 may include a gas channel (to which a source gas is supplied) and first and second electrodes 144, 146 (at both sides of the gas channel and configured to convert the source gas into a plasma state by a voltage applied thereto). The plasma nozzle 142 may discharge the reactive gas P in the plasma state to the defect location.

The type of reactive gas P may be selected or determined according to a type of contaminant (C) (e.g., the plating solution material). In an implementation, the reactive gas P may include chlorine, fluorine, or the like. Accordingly, organic substances may be effectively removed by directly irradiating high-energy radicals generated in the atmospheric pressure plasma (direct plasma) to the contaminants. Various contaminants that cannot be removed by a megasonic device may be efficiently removed. In an implementation, the contaminant C at the defect location of the surface of the base plate 40, e.g., at the support portion 46 may be effectively removed.

In an implementation, as illustrated in FIG. 8, the first wet cleaning part 150 may include a pod stage 152 supporting the base plate 40 (or the cover 50) of the inner pod 30 and a nozzle 156 for spraying a cleaning solution. In an implementation, the first wet cleaning part 150 may further include an ultrasonic/megasonic device 158 for transmitting high frequency acoustic energy to the cleaning solution.

The nozzle 156 may spray the cleaning solution, e.g., DI (deionized) water, onto the base plate 40 on the pod stage 152. The ultrasonic/megasonic device 158 may include a piezoelectric transducer acoustically coupled to a resonator. The transducer may be electrically excited to vibrate, and the resonator may transmit high frequency acoustic energy to the cleaning solution. Accordingly, bubble cavitation generated by ultrasonic/megasonic energy may vibrate particles on the inner pod 30, and thus, the particles may be vibrated away from the surface of the inner pod 30 and removed from the surface through the flowing fluid supplied by the nozzle 156.

The pod stage 152 of the first wet cleaning part 150 may support both the base plate 40 and the cover 50, and a wet cleaning process may be performed on the entire surface of the base plate 40 and the entire surface of the cover 50.

The second wet cleaning part 160 may include components substantially the same or similar to the first wet cleaning part 150. Thus, a repeated detailed explanation concerning the second wet cleaning part may be omitted.

In an implementation, the first and second wet cleaning parts 150, 160 may further include a dryer for drying the inner pod 30 and the outer pod 20 respectively, cleaned by the fluid. In an implementation, the reticle pod cleaning system 100 may further include additional dryers for drying the cleaned inner pod 30 and outer pod 20, respectively.

The outer pod 20 and the inner pod 30 (on which the wet cleaning processes have been completed) may be transferred to the pod disassembly/assembly part 120 respectively, and then, the outer pod 20 and the inner pod 30 may be reassembled and unloaded through the pod loading part 110.

After the cleaning, the reticle R may be mounted in the reticle pod 10, and the reticle R may be stored and transported while mounted in the reticle pod 10, and then the reticle R may be loaded into a reticle stage of exposure equipment for performing an exposure process.

Figure 9:
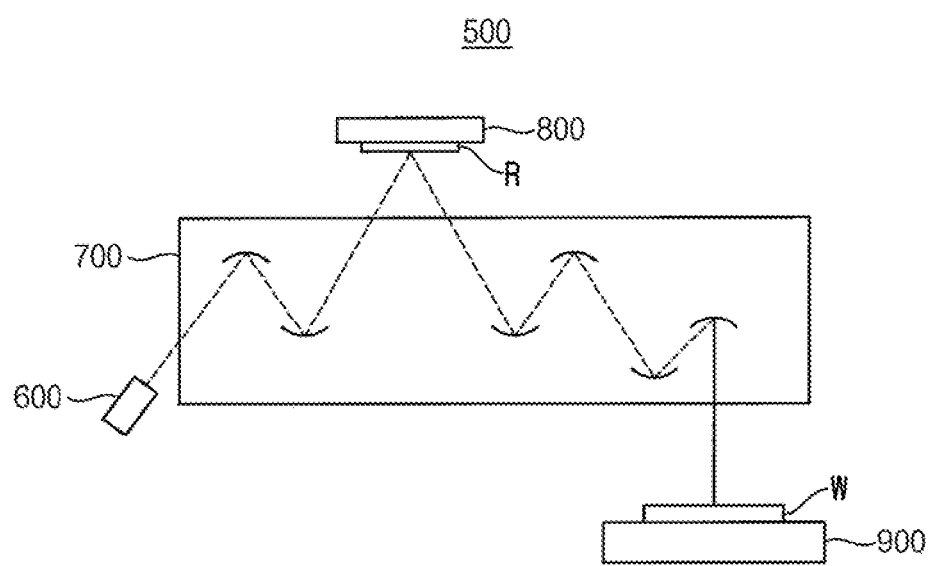
FIG. 9 is a cross-sectional view of exposure equipment in accordance with example embodiments.

FIG. 9 is a cross-sectional view of exposure equipment in accordance with example embodiments.

Referring to FIG. 9, exposure equipment 500 may include a light illumination portion 600, a mirror system 700, a reticle stage 800, and a wafer stage 900. The mirror system 700 may include an illumination mirror system and a projection mirror system.

In an implementation, the exposure equipment 500 may perform a reflective photolithography process using the reticle R.

In an implementation, the light illumination portion 600 may include a light source, a light collector, or the like. The light source may generate extreme ultraviolet light (EUVL). In an implementation, the light source may generate light having a wavelength of about 13.5 nm, e.g., the EUV light, using carbon plasma. The EUV light generated from the light source may be irradiated to the illumination mirror system 700 through the light collector.

The illumination mirror system may include a plurality of illumination mirrors. The illumination mirrors may condense the EUV light in order to reduce loss of the EUV light which propagates out of the mirrored irradiating paths.

The reticle stage 800 may mount the reticle R on a lower surface thereof and move in a horizontal direction. The reticle R may be mounted on the lower surface of the reticle stage 800 such that the surface (of the front side) on which optical patterns of the photomask M are formed, may face downward.

The EUV light transferred from the illumination mirror system may be irradiated to the reticle R on the reticle stage 800. The EUV light reflected from the reticle R on the reticle stage 800 may be transferred to the projection mirror system.

The projection mirror system may receive the EUV light reflected from the reticle R and transfer the received EUV light to a wafer W. The projection mirror system may include a plurality of projection mirrors.

The wafer stage 900 may settle or support the wafer W and move in a horizontal direction. In an implementation, a photoresist film having a predetermined thickness may be formed on the wafer W, and the EUV light may be focused on the photoresist film. Accordingly, the exposure equipment 500 may generate and irradiate the light on the photoresist film formed on the wafer W. Thus, the photoresist film may be partially exposed based on the optical pattern information of the photomask M to form a photoresist pattern, and then a layer underlying the photoresist pattern may be partially etched to form a pattern on the wafer W.

Hereinafter, a cleaning method of the reticle pod using the above reticle pod cleaning system and an exposure method will be explained.

Figure 10:
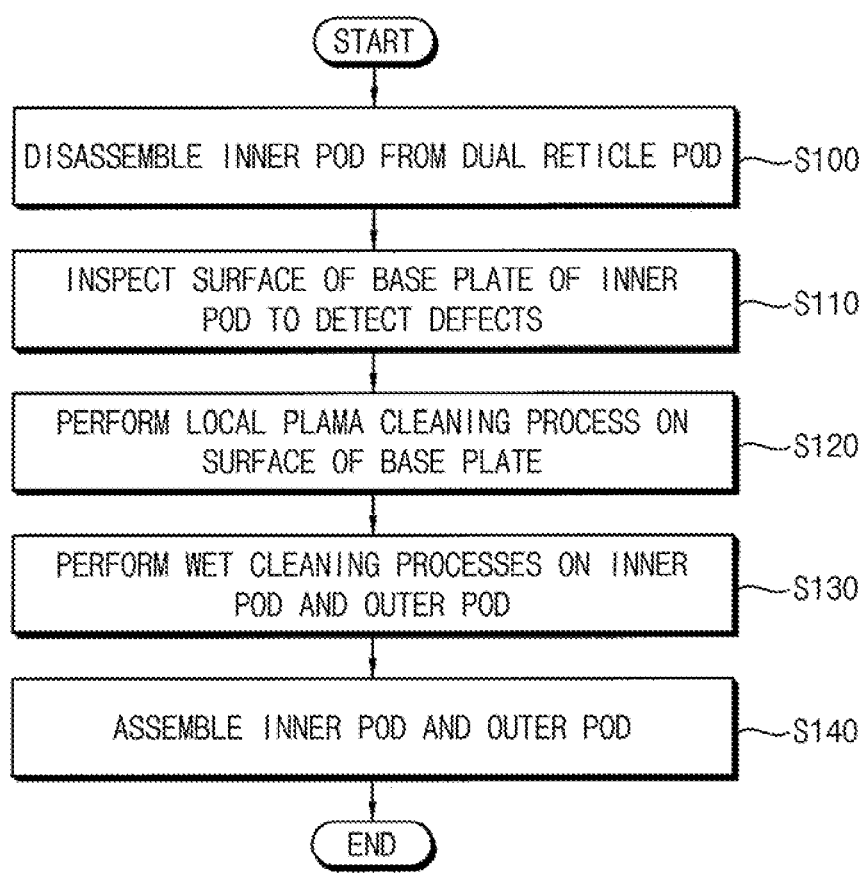
FIG. 10 is a flow chart of a method of cleaning a reticle pod in accordance with example embodiments.

FIG. 10 is a flow chart of a method of cleaning a reticle pod in accordance with example embodiments.

Referring to FIGS. 1 to 8 and 10, first, a reticle pod 10 to be cleaned may be provided, and an inner pod 30 may be disassembled or detached from the (e.g., other parts of the) reticle pod 10 (S100).

There may be contaminants (e.g., particles or stains) on a surface on the reticle pod 10 that has been shipped from a manufacturer or has been used a certain number of times in a semiconductor manufacturing plant (Fab). In order to remove such contaminants, the reticle pod 10 may be loaded into a reticle pod cleaning system 100. In here, the reticle pod 10 (from which a reticle R has been removed) may be loaded into a pod loading part 110 of the cleaning system 100.

The reticle pod 10 may be a dual reticle pod. The dual reticle pod 10 may include the outer pod 20 and the inner pod 30. The inner pod 30 and the outer pod 20 may be designed in a way that facilitates their opening and closing (detaching and attaching) and general manipulation.

The reticle pod 10 loaded into the pod loading part 110 of the reticle pod cleaning system 100 may be transferred to a pod disassembly/assembly part 120, and then, the reticle pod 10 may be disassembled into the outer pod 20 and the inner pod 30 by one or more manipulators.

Then, a surface of the base plate 40 of the inner pod 30 may be inspected to detect a defect (S110), and a local plasma cleaning process may be performed at a defect location on the surface of the base plate 40 (S120).

In the inner pod 30, the guide pin 44 and the support portion 46 may protrude from an upper surface of the base plate 40 to contact and support the reticle (R). Accordingly, if external vibrations or impacts were to occur, particles could be generated at the contact portion between the guide pin 44 and the support portion 46. Further, contaminants (such as stains) could remain on the base plate 40 (or a cover 50) when drying is poor after coating a plating solution in order to form a plating layer on the surface of the base plate 40 (or the cover 50). In order to detect locations of such contaminants, the base plate 40 (or the cover 50) of the inner pod 30 may be transported to the pod inspection part 130.

In an implementation, the base plate 40 may be placed on the pod stage 132, the surface of the base plate 40 may be scanned with the incident beam B, and then, light reflected from the surface of the base plate 40 may be collected to detect the defect locations.

The inspection spot of the pod inspection part 130 may be moved relative to the surface of the base plate 40 of the inner pod 30. In an implementation, as the incident beam B is moved along one direction, the pod stage 132 may be rotated by the driver 134 to inspect the entire surface of the base plate 40.

The incident beam B (generated by an illumination light source S) may be focused onto the surface of the base plate 40 by an objective lens L, and the light reflected from the surface of the base plate 40 may be collected by a detector array 138. Detection signals generated in the detector array 138 may be provided to a computing system 139 and the defect locations of contaminants such as stains may be detected. The location of the contaminant remaining on the surface of the base plate 40 may be designated as the defect location.

When a defect is found on the surface of the base plate 40, in order to remove the defect, the base plate 40 may be moved to a plasma cleaning part 140.

In an implementation, the base plate 40 may be placed on the pod stage 132, a plasma nozzle 142 may be moved to face the defect location on the surface of the base plate 40, and then, the gas plasma or reactive gas (P) may be discharged on the contaminant at the defect location through the plasma nozzle 142.

In an implementation, the plasma nozzle 142 may be provided as a part of an atmospheric pressure plasma jet injector. The plasma nozzle 142 may be movable along a nozzle arm 143 on the pod stage 132. The plasma nozzle 142 may be used for performing a local cleaning process by rotation of the pod stage 132 and a translational movement along the nozzle arm 143. In an implementation, the plasma nozzle 142 may be moved toward the defect location on the surface of the base plate 40. The plasma nozzle 142 may move to face the defect location, to perform a local plasma cleaning process.

A source gas (G) may be supplied through a gas channel inside the plasma nozzle 142, and the source gas (G) may be converted into a plasma state by a voltage applied between the first and second electrodes 144, 146, and the reactive gas (P) in the plasma state may be discharged toward the defect location.

The type of reactive gas (P) (e.g., and source gas (G)) may be selected according to a type of contaminant (C) (e.g., a plating solution material). In an implementation, the reactive gas may include chlorine, fluorine, or the like. Accordingly, high-energy radicals generated in the atmospheric pressure plasma (direct plasma) may be irradiated directly onto the contaminant to effectively remove organic substances. Thus, various contaminants which cannot be removed by a megasonic device may be efficiently removed. In addition, the contaminant C on the surface of the base plate 40, e.g., on the support portion 46, may be effectively removed.

Then, a wet cleaning process may be performed on the inner pod 30 and the outer pod 20 (S130).

In an implementation, the inner pod 30 (from which the contaminants have been removed) may be transferred to a first wet cleaning part 150. In an implementation, if a defect is not found on the surface of the base plate 40, the base plate 40 may be transferred directly to the first wet cleaning part 150 without going through the plasma cleaning part 140 (e.g., in order to reduce time and costs).

In an implementation, the outer pod 20 may be transferred to the second wet cleaning part 160. In an implementation, the outer pod 20 may be transferred to the second wet cleaning part 160 after passing through the plasma cleaning part 140.

In an implementation, the inner pod 30 may be positioned on a pod stage 152, and a cleaning solution may be sprayed out on the inner pod 30 through a nozzle 156. At this time, high-frequency acoustic energy may be transmitted to the cleaning solution on the inner pod 30.

The nozzle 156 may spray out the cleaning solution, e.g., DI (deionized) water, on the inner pod 30 on the pod stage 152. An ultrasonic/megasonic device 158 may transmit high-frequency acoustic energy to the cleaning solution. Accordingly, bubble cavitation generated by ultrasonic/ megasonic energy may vibrate particles on the inner pod 30, and thus, the particles may be vibrated away from the surface of the inner pod 30 and removed from the surface through the flowing fluid supplied by the nozzle 156.

The pod stage 152 of the first wet cleaning part 150 may supports both the base plate 40 and the cover 50, and a wet cleaning process may be performed on the entire surface of the base plate 40 and the entire surface of the cover 50.

Similarly, the second wet cleaning part 160 may perform a wet cleaning process on the entire surface of the outer pod 20.

Then, the inner pod 30 and the outer pod 20 may be reassembled (S140) (e.g., may be coupled together).

The outer pod 20 and the inner pod 30 (on which the wet cleaning processes have been completed) may be transferred to the pod disassembly/assembly part 120 respectively, and then, the outer pod 20 and the inner pod 30 may be reassembled and unloaded through the pod loading part 110.

After the cleaning, the reticle R may be mounted in the reticle pod 10, and the reticle R may be stored and transported while mounted in the reticle pod 10. Then, the reticle R may be loaded into a reticle stage of exposure equipment for performing an exposure process.

FIG. 11 is a flow chart of an exposure method in accordance with example embodiments. The cleaning step of the reticle pod of the exposure method is substantially the same or similar to the cleaning method of the reticle pod described with reference to FIG. 9. Thus, same or like reference numerals may be used to refer to the same or like elements and any further repetitive explanation concerning the above elements may be omitted.

Referring to FIGS. 1 to 11, the dual reticle pod 10 may be provided (S10), and then, the dual reticle pod 10 may be cleaned (S20). Then, the reticle R may be accommodated in the dual reticle pod 10 (S30), the dual reticle pod 10 in which the reticle R is accommodated may be transferred to exposure equipment 500, and then, an exposure process may be performed on a wafer using the reticle R (S40).

After the cleaning, the reticle R may be mounted in the reticle pod 10, the reticle R may be stored and transported while mounted in the reticle pod 10, and then the reticle R may be loaded into a reticle stage 800 of the exposure equipment for performing an exposure process.

In an implementation, the exposure equipment 500 may perform a reflective photolithography process using the reticle R.

EUV light transferred from an illumination mirror system may be irradiated to the reticle R on the reticle stage 800. The EUV light reflected from the reticle R on the reticle stage 800 may be transferred to a projection mirror system. The projection mirror system may receive the EUV light reflected from the reticle R and transfer it to the wafer W.

The wafer stage 900 may support or accommodate the wafer W and may move in a horizontal direction. In an implementation, a photoresist film having a predetermined thickness may be formed on the wafer W, and EUV light may be focused on the photoresist film. Accordingly, the exposure equipment 500 may generate and irradiate the light on the photoresist film formed on the wafer W. Thus, the photoresist film may be partially exposed based on the optical pattern information of the photomask M to form a photoresist pattern, and then a layer underlying the photoresist pattern may be partially etched to form a pattern on the wafer W.

By way of summation and review, when extreme ultraviolet (EUV) light with a wavelength of 13.5 nm is applied in lithography tool, the cleanliness of the reticle pod for extreme ultraviolet light may be important.

One or more embodiments may provide a method of cleaning a reticle pod for storing and transporting a reticle applied to an extreme ultraviolet tool.

One or more embodiments may provide a method of cleaning a reticle pod in order to maintain high cleanliness.

One or more embodiments may provide an exposure method using the cleaning method.

One or more embodiments may provide a cleaning system for a reticle pod for performing the cleaning method.

According to an embodiment, high-energy radicals generated in the atmospheric pressure plasma (direct plasma) may be irradiated directly to contaminants to thereby remove organic substances. Thus, various contaminants which cannot be removed by a megasonic device may be efficiently removed. Further, the contaminant on the inner pod surface, e.g., on protruding structures, may be effectively removed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of cleaning a reticle pod, the method comprising:
   receiving the reticle pod that includes an inner pod and an outer pod surrounding the inner pod;
   disassembling the inner pod from the outer pod;
   inspecting a surface of a base plate of the inner pod to detect defects;
   performing a local plasma cleaning process at a defect location on the surface of the base plate;
   performing a wet cleaning process on the inner pod;
   performing a wet cleaning process on the outer pod in parallel with and at the same time the inspecting and wet cleaning of the inner pod is performed; and
   reassembling the inner pod to the outer pod.

2. The method as claimed in claim 1, wherein the inner pod includes:
   the base plate on which a reticle is accommodatable; and
   an inner cover covering the base plate.

3. The method as claimed in claim 1, wherein inspecting the surface of the base plate includes:
   placing the base plate on a pod stage;
   scanning an incident beam across the surface of the base plate; and
   collecting a light reflected from the surface of the base plate to detect the defect location.

4. The method as claimed in claim 3, wherein detecting the defect location includes designating a location where a contaminant remains on the surface of the base plate as the defect location.

5. The method as claimed in claim 1, wherein performing the local plasma cleaning process on the surface of the base plate includes:
   placing the base plate on a pod stage;

placing a plasma nozzle to face the defect location on the surface of the base plate; and discharging gas plasma through the plasma nozzle.

6. The method as claimed in claim 5, wherein the plasma nozzle is a part of an atmospheric pressure plasma jet injector.

7. The method as claimed in claim 5, wherein discharging the gas plasma through the plasma nozzle includes:

supplying a source gas through a gas channel inside the plasma nozzle;

converting the source gas into a plasma state by applying a voltage between a first electrode and a second electrode; and discharging a reactive gas in the plasma state to the defect location.

8. The method as claimed in claim 1, wherein performing the wet cleaning process on the inner pod includes:

placing the base plate on a pod stage; and spraying a cleaning solution onto the inner pod through a nozzle.

9. The method as claimed in claim 8, wherein performing the wet cleaning process on the inner pod further includes transmitting high frequency acoustic energy to the cleaning solution on the inner pod.

10. A method of cleaning a reticle pod, the method comprising:

receiving a dual reticle pod that includes an inner pod and an outer pod;

disassembling the dual reticle pod to extract the inner pod;

inspecting a surface of a base plate of the inner pod to detect defects;

performing a local plasma cleaning process at a defect location on the surface of the base plate using an atmospheric pressure plasma injector;

performing wet cleaning processes on the inner pod and the outer pod respectively, performing the wet cleaning process on the outer pod being performed in parallel with and at the same time the inspecting and wet cleaning of the inner pod is performed; and reassembling the dual reticle pod to attach the inner pod and the outer pod.

11. The method as claimed in claim 10, wherein the inner pod includes:

the base plate on which a reticle is accommodatable; and an inner cover covering the base plate.

12. The method as claimed in claim 10, wherein inspecting the surface of the base plate includes:

placing the base plate on a pod stage;

scanning an incident beam across the surface of the base plate; and collecting a light reflected from the surface of the base plate to detect the defect location.

13. The method as claimed in claim 12, wherein detecting the defect location includes designating a location where a contaminant remains on the surface of the base plate as the defect location.

14. The method as claimed in claim 10, wherein performing the local plasma cleaning process on the surface of the base plate includes:

placing the base plate on a pod stage; and discharging gas plasma toward the defect location on the surface of the base plate through a nozzle of the atmospheric pressure plasma injector.

15. The method as claimed in claim 14, wherein discharging the gas plasma through the nozzle of the atmospheric pressure plasma injector includes:

supplying a source gas through a gas channel inside the nozzle;

converting the source gas into a plasma state by applying a voltage between a first electrode and a second electrode; and discharging a reactive gas in the plasma state to the defect location.

16. The method as claimed in claim 10, wherein performing the wet cleaning process on the inner pod includes:

placing the base plate on a pod stage; and spraying a cleaning solution onto the inner pod through a nozzle.

17. The method as claimed in claim 16, wherein performing the wet cleaning process on the inner pod further includes transmitting high frequency acoustic energy to the cleaning solution on the inner pod.

18. The method as claimed in claim 10, further comprising:

accommodating a reticle within the inner pod; and transferring the dual reticle pod containing the reticle to exposure equipment.

19. An exposure method, comprising:

receiving a dual reticle pod;

cleaning the dual reticle pod;

accommodating a reticle within the cleaned dual reticle pod;

transferring the dual reticle pod containing the reticle to exposure equipment; and performing an exposure process on a wafer using the reticle;

wherein cleaning the dual reticle pod includes:

disassembling the dual reticle pod to extract an inner pod and an outer pod;

detecting defects by inspecting a surface of a base plate of the inner pod;

performing a local plasma cleaning process at a defect location on the surface of the base plate using an atmospheric pressure plasma injector;

performing a wet cleaning process on the inner pod; and performing a wet cleaning process on the outer pod in parallel with and at the same time the detecting defects and wet cleaning of the inner pod is performed.

* * * * *